(12) United States Patent
Shu et al.

(10) Patent No.: US 9,000,578 B2
(45) Date of Patent: Apr. 7, 2015

(54) PACKAGE SYSTEMS HAVING AN OPENING IN A SUBSTRATE THEREOF AND MANUFACTURING METHODS THEREOF

(75) Inventors: Chia-Pao Shu, Hsinchu (TW); Chun-wen Cheng, Zhubei (TW); Kuei-Sung Chang, Kaohsiung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 907 days.

(21) Appl. No.: 12/900,718

(22) Filed: Oct. 8, 2010

(65) Prior Publication Data

US 2012/0086126 A1    Apr. 12, 2012

(51) Int. Cl.
*H01L 23/48* (2006.01)
*H01L 23/52* (2006.01)
(Continued)

(52) U.S. Cl.
CPC ............ *H01L 24/83* (2013.01); *B81C 1/00238* (2013.01); *B81C 1/00269* (2013.01); *B81C 2203/019* (2013.01); *H01L 24/03* (2013.01); *H01L 24/05* (2013.01); *H01L 24/06* (2013.01); *H01L 24/29* (2013.01); *H01L 24/30* (2013.01); *H01L 24/32* (2013.01); *H01L 24/94* (2013.01); *H01L 25/0657* (2013.01); *H01L 2224/0345* (2013.01); *H01L 2224/03452* (2013.01); *H01L 2224/0362* (2013.01); *H01L 2224/04026* (2013.01); *H01L 2224/05551* (2013.01); *H01L 2224/05555* (2013.01); *H01L 2224/05557* (2013.01); *H01L 2224/05617* (2013.01); *H01L 2224/05638* (2013.01); *H01L 2224/061* (2013.01); *H01L 2224/26145* (2013.01); *H01L 2224/29017* (2013.01); *H01L 2224/2902* (2013.01); *H01L 2224/29101* (2013.01); *H01L 2224/29111* (2013.01); *H01L 2224/29117* (2013.01); *H01L 2224/29124* (2013.01); *H01L 2224/29138* (2013.01); *H01L 2224/29144* (2013.01); *H01L 2224/29147* (2013.01); *H01L 2224/29155* (2013.01); *H01L 2224/29166* (2013.01); *H01L 2224/29181* (2013.01); *H01L 2224/29291* (2013.01); *H01L 2224/32058* (2013.01); *H01L 2224/321* (2013.01); *H01L 2224/32106* (2013.01); *H01L 2224/32148* (2013.01); *H01L 2224/83203* (2013.01); *H01L 2224/83365* (2013.01); *H01L 2224/83805* (2013.01); *H01L 2924/00* (2013.01); *H01L 2924/00014* (2013.01); *H01L 2924/01013*
(Continued)

(58) Field of Classification Search
USPC .......... 257/618, 625, 688, 782, 783, E21.122, 257/E33.01, E23.01; 438/455
See application file for complete search history.

(56) References Cited

U.S. PATENT DOCUMENTS 7,104,129 B2    9/2006 Nasiri et al.
7,442,570 B2 *  10/2008 Nasiri et al. .................... 438/48
(Continued)

*Primary Examiner* — Hung Vu
(74) *Attorney, Agent, or Firm* — Lowe Hauptman & Ham, LLP

(57) ABSTRACT

A package system includes a first substrate and a second substrate. The second substrate is electrically coupled with the first substrate. The second substrate includes at least one first opening. At least one electrical bonding material is disposed between the first substrate and the second substrate. A first portion of the at least one electrical bonding material is at least partially filled in the at least one first opening.

20 Claims, 6 Drawing Sheets

(51) Int. Cl.
  *B81C 1/00* (2006.01)
  *H01L 23/00* (2006.01)
  *H01L 25/065* (2006.01)

(52) U.S. Cl.
  CPC ......... (2013.01); *H01L 2924/01014* (2013.01); *H01L 2924/01029* (2013.01); *H01L 2924/01032* (2013.01); *H01L 2924/01033* (2013.01); *H01L 2924/01037* (2013.01); *H01L 2924/01049* (2013.01); *H01L 2924/0105* (2013.01); *H01L 2924/01073* (2013.01); *H01L 2924/01079* (2013.01); *H01L 2924/0132* (2013.01); *H01L 2924/01322* (2013.01); *H01L 2924/014* (2013.01); *H01L 2924/1461* (2013.01)

(56) References Cited

U.S. PATENT DOCUMENTS

| | | | |
|---|---|---|---|
| 8,119,498 B2 * | 2/2012 | Mengi et al. | 438/456 |
| 8,674,495 B2 * | 3/2014 | Shu et al. | 257/688 |
| 2012/0086127 A1 * | 4/2012 | Shu et al. | 257/773 |

* cited by examiner

PACKAGE SYSTEMS HAVING AN OPENING IN A SUBSTRATE THEREOF AND MANUFACTURING METHODS THEREOF

TECHNICAL FIELD

The present disclosure relates generally to the field of semiconductor package systems, and more particularly, to package systems and manufacturing methods thereof.

BACKGROUND OF THE DISCLOSURE

Micro electro mechanical system (MEMS) devices are a recent development in the field of integrated circuit technology and include devices fabricated using semiconductor technology to form mechanical and electrical features. Examples of MEMS devices include gears, levers, valves, and hinges. Common applications of MEMS devices include accelerometers, pressure sensors, actuators, mirrors, heaters, and printer nozzles.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

Figure 2:
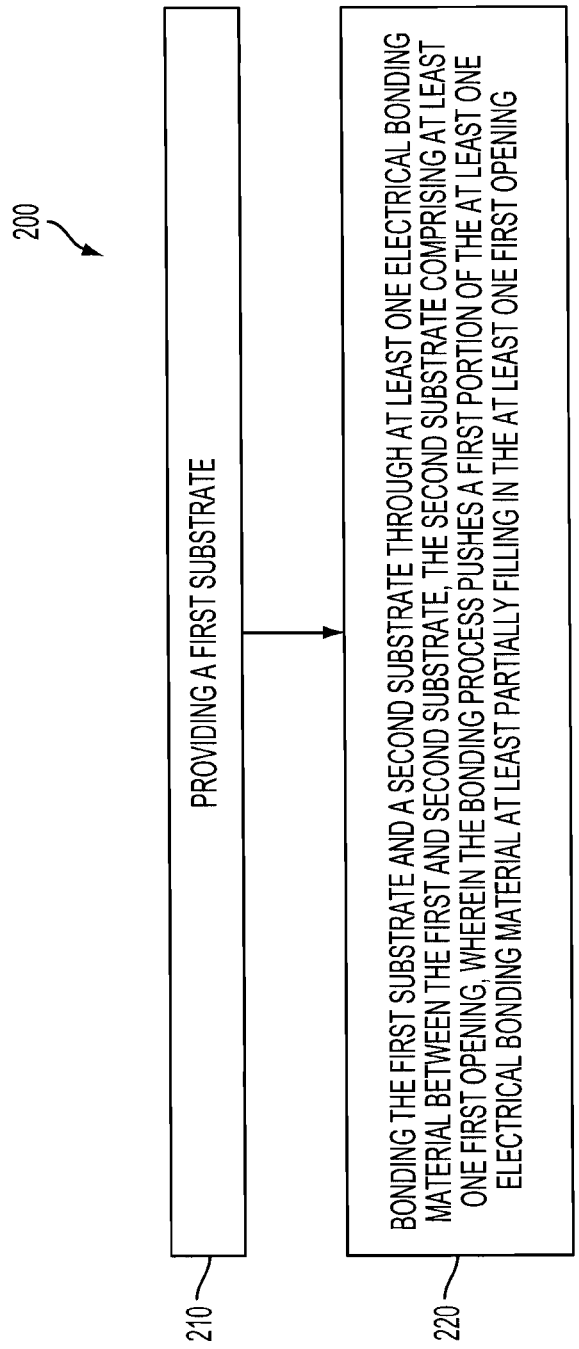

Illustrated in FIG. 2 is a flowchart of an exemplary method of forming a plurality of package systems.

FIGS. 3A-3F are schematic cross-sectional views of package systems during various fabrication stages.

DETAILED DESCRIPTION OF THE DISCLOSURE

A eutectic bonding has been applied to electrically couple two substrates together to form a MEMS device. Generally, the substrates each have a bonding material formed thereon. For example, an aluminum-germanium (Al—Ge) eutectic bonding is formed by eutectic bonding an Al pad on a substrate with a Ge pad on another substrate. During the eutectic bonding, the Al pad is subjected to a thermal treatment and a pressure, such that the Al pad is softened and melted. The pressure of the eutectic bonding presses the material of the Al pad stretching laterally. It is found that the laterally-stretching Al material may contact and be electrically short to neighboring eutectic bonding material.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
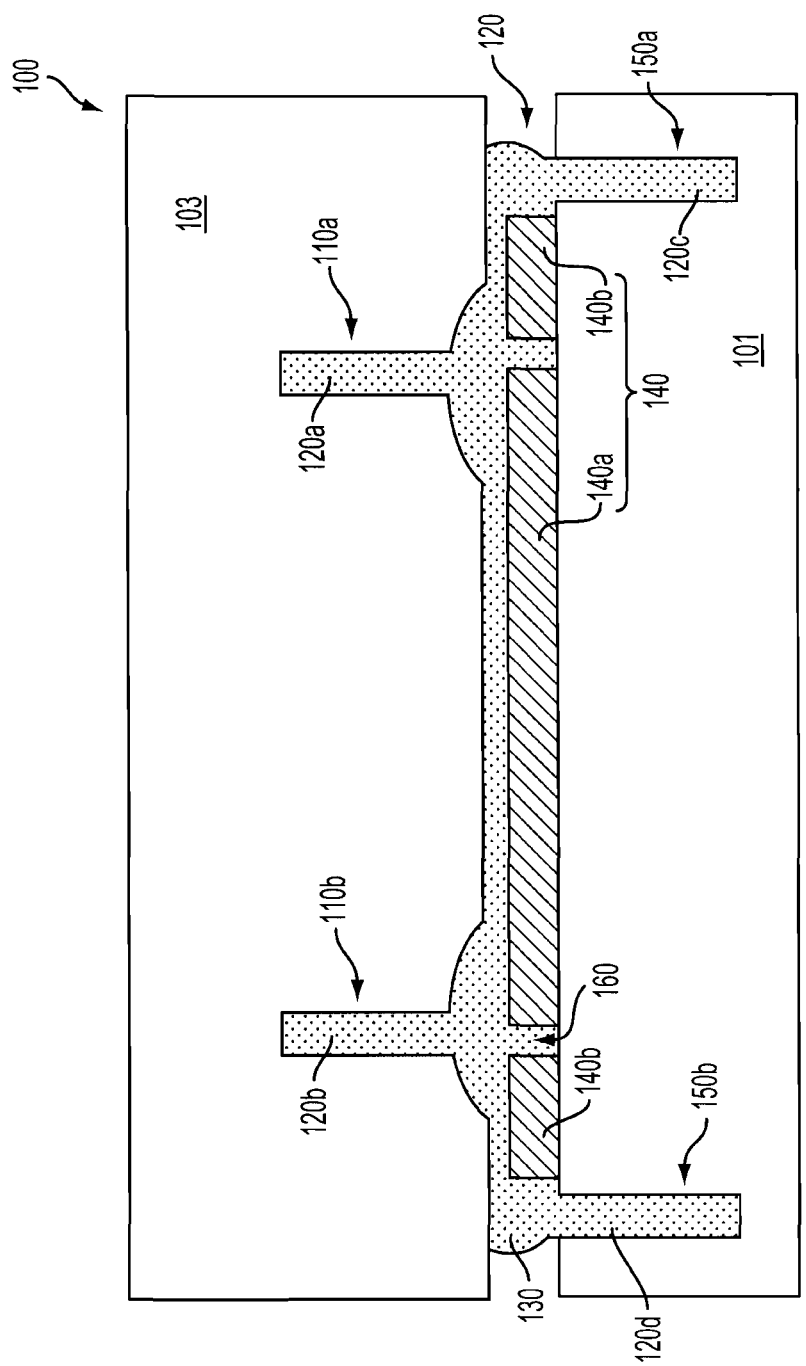
FIG. 1 is a schematic cross-sectional view of an exemplary package system.

FIG. 1 is a schematic cross-sectional view of an exemplary package system. In FIG. 1, a package system 100 can include a substrate 101 that can be electrically coupled with a substrate 103. The substrate 103 can include at least one opening, e.g., openings 110a and 110b. The package system 100 can include at least one electrical bonding material, e.g., an electrical bonding material 120, disposed between the substrates 101 and 103. A portion, e.g., portions 120a and 120b, of the electrical bonding material 120 can be at least partially filled in the openings 110a and 110b, respectively.

The substrates 101 and 103 can be assembled to form a hermetic or non-hermetic package system. In some embodiments, the substrates 101 and/or 103 can each be a silicon substrate doped with a P-type or N-type dopant. In other embodiments, the substrates 101 and/or 103 may each alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrates 101 and/or 103 could each include an epitaxial layer (epi layer), may be strained for performance enhancement, and may include a silicon-on-insulator (SOI) structure.

In some embodiments, the substrate 101 can include an integrated circuit (not shown) formed thereon. The integrated circuit can be formed, for example, by a complementary metal-oxide-semiconductor (CMOS) technology. The integrated circuit can include, for example but is not limited to, a logic circuit, an analog circuit, a mixed-signal circuit, and/or any suitable integrated circuit. In some embodiments, the substrate 101 can be referred to as a base substrate.

In some embodiments, the substrate 103 can include another integrated circuit (not shown) formed thereon. The integrated circuit can be similar to that of the substrate 101. In other embodiments, the substrate 103 can include a MEMS device (not shown). The MEMS device can include, for example, an accelerometer, a gyroscope, a mirror for optical applications, a switch or a resonator within a radio frequency (RF) device, a rotational flexure, a translational flexure, and/or any suitable MEMS device. In still other embodiments, the integrated circuit on the substrate 103 may merely include a conductive wire routing for an electrical connection. In some embodiments, the substrate 103 can be referred to as a cap substrate.

In some embodiments, the openings 110a and 110b can continuously extend in the substrate 103, such that the openings 110a and 110b can meet each other. In other embodiments, the openings 110a and 110b can be discontinuously disposed in the substrate 103. In still other embodiments, the openings 110a and 110b can be trench openings. The openings 110a and 110b do not penetrate all the way through the substrate 103. In some embodiments, the openings 110a and 110b can each have a depth ranging from about 2 µm to about 10 µm. The openings 110a and 110b can each have a width ranging from about 1 µm to about 2 µm. It is noted that the dimensions of the openings 110a and 110b are merely exemplary. The dimensions can be modified.

In some embodiments, the electrical bonding material 120 can be a eutectic bonding material, glass bonding material, solder bonding material, or any suitable bonding material. In some embodiment using a eutectic bonding, the electrical bonding material 120 can include at least one material, such as aluminum (Al), copper (Cu), silicon (Si), germanium (Ge), titanium (Ti), tantalum (Ta), gold (Au), nickel (Ni), tin (Sn), other suitable bonding materials, and/or any combinations thereof. In other embodiments, the electrical bonding material 120 can include a metallic material 130 and a semiconductor material 140. The metallic material 130 can be made of, e.g., Al, Cu, Ti, Ta, Au, Ni, Sn, other metallic materials, and/or any combinations. The semiconductor material 140 can be made of, e.g., Ge, Si, other semiconductor material, and/or any combinations thereof. The eutectic bonding between the substrates 101 and 103 can be formed by interacting the metallic material 130 and the semiconductor material 140.

During a eutectic bonding, the metallic material 130 can be softened and/or melted. The openings 110a and 110b are configured to at least partially accommodate the softened metallic material 130. In some embodiments, the softened metallic material 130 can completely fill in the openings 110a and 110b as shown in FIG. 1. In other embodiments, the softened metallic material 130 may partially fill in the openings 110a and 110b. It is noted that the number of the openings 110a and 110b is merely exemplary. In some embodiments, more openings can be disposed in the substrate 103 for accommodating the metallic material 130.

In some embodiments, the semiconductor material 140 can optionally include a pad 140a and at least one guard ring, e.g., a guard ring 140b. The guard ring 140b can be disposed around the pad 140a. The guard ring 140b can be continuously or discontinuously disposed around the pad 140a. In some embodiments, the guard ring 140b can provide more semiconductor materials to interact with the metallic material 130 that is softened and melted during the eutectic bonding. Though merely showing a single guard ring 140b in FIG. 1, the scope of this application is not limited thereto. In some embodiments, more than one guard ring can be disposed around the pad 140a. In other embodiments, the guard ring 140b can be saved.

Referring again to FIG. 1, in some embodiments, a gap 160 is formed between the pad 140a and the guard ring 140b. In some embodiments, the opening 110a can face at least one of the pad 140a and the gap 160. In some embodiments, the gap 160 can have a width of about 3 μm. In other embodiments, the width of the gap 160 can be more or less than 3 μm.

In some embodiments, the substrate 101 can optionally include at least one opening, e.g., openings 150a and 150b. The openings 150a and 150b can be configured to at least partially accommodate a portion, e.g., portions 120c and 120d, respectively, of the electrical bonding material 120. In some embodiments, the openings 150a and 150b can continuously extend in the substrate 101, such that the openings 150a and 150b can meet each other. In other embodiments, the openings 150a and 150b can be discontinuously disposed in the substrate 101. In still other embodiments, the openings 150a and 150b can be trench openings. The openings 150a and 150b do not penetrate all the way through the substrate 101. In yet still other embodiments, the openings 110a and 150a are misaligned from each other in a direction that is perpendicular to surfaces of the substrates 101 and 103. In some embodiments, the openings 150a and 150b can each have a depth ranging from about 2 μm to about 10 μm. The openings 150a and 150b can each have a width ranging from about 1 μm to about 2 μm. It is noted that the dimensions of the openings 150a and 150b are merely exemplary. The dimensions can be modified.

During the eutectic bonding, the metallic material 130 can be softened and/or melted. The openings 150a and 150b are configured to at least partially accommodate the softened metallic material 130. In some embodiments, the softened metallic material 130 can completely fill in the openings 150a and 150b as shown in FIG. 1. In other embodiments, the softened metallic material 130 may partially fill in the openings 150a and 150b. It is noted that the number of the openings 150a and 150b is merely exemplary. In some embodiments, more openings can be disposed in the substrate 101 for accommodating the metallic material 130.

It is noted that though showing the openings 150a and 150b disposed around the pad 140a and the guard ring 140b, the scope of the current application is not limited thereto. In some embodiments, the openings 150a and 150b can be disposed around the pad 140a, and the guard ring 140b is saved. In other embodiments, the openings 150a and 150b can be disposed between the pad 140a and the guard ring 140b.

Illustrated in FIG. 2 is a flowchart of an exemplary method of forming a plurality of package systems. FIGS. 3A-3F are schematic cross-sectional views of package systems during various fabrication stages. Items of FIGS. 3A-3F that are the same or similar items in FIG. 1 are indicated by the same reference numerals, increased by 200. It is understood that FIGS. 3A-3F have been simplified for a better understanding of the concepts of the present disclosure. Accordingly, it should be noted that additional processes may be provided before, during, and after the method 200 of FIG. 2, and that some other processes may only be briefly described herein.

Figure 3A:
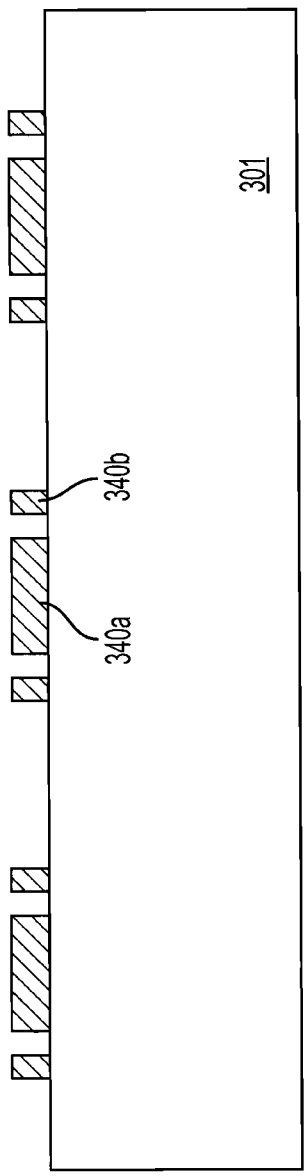

Referring to FIGS. 2 and 3A, the process shown in block 210 can include providing a substrate, e.g., a substrate 301. In some embodiments, pads 340a and guard rings 340b can be patterned on the substrate 301. The pads 340a and guard rings 340b can be formed, for example, by physical vapor deposition (PVD) and/or chemical vapor deposition (CVD), a photolithographic process, and an etch process.

Figure 3B:
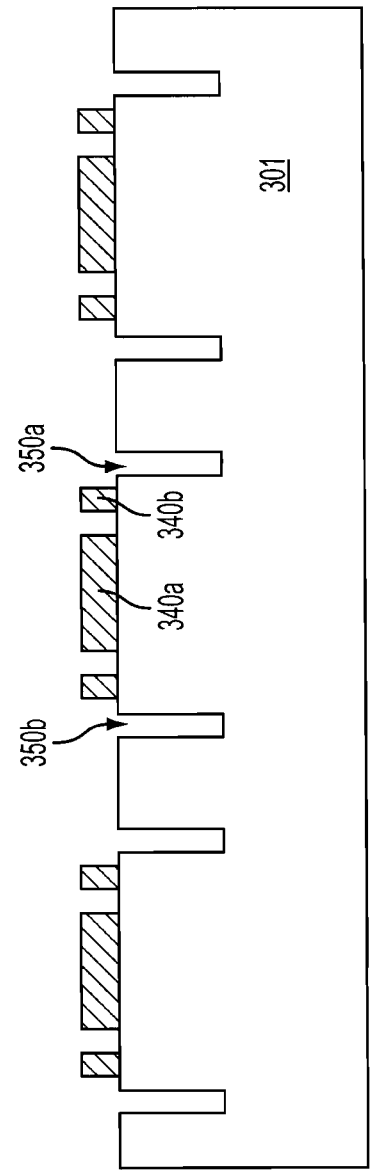

In some embodiments, openings 350a and 350b can be optionally formed in the substrate 301 as shown in FIG. 3B. The openings 350a and 350b can be formed, for example, by a photolithographic process, and an etch process. In some embodiments, the openings 350a and 350b are formed and meet each other in the substrate 301. In some embodiments, the openings 350a and 350b are formed around the pad 340a and the guard ring 340. In other embodiments, the openings 350a and 350b can be each formed between the pad 340a and the guard ring 340b. In still other embodiments, the openings 350a and 350b can be formed around the pad 340a and the guard ring 340b can be saved.

Figure 3C:
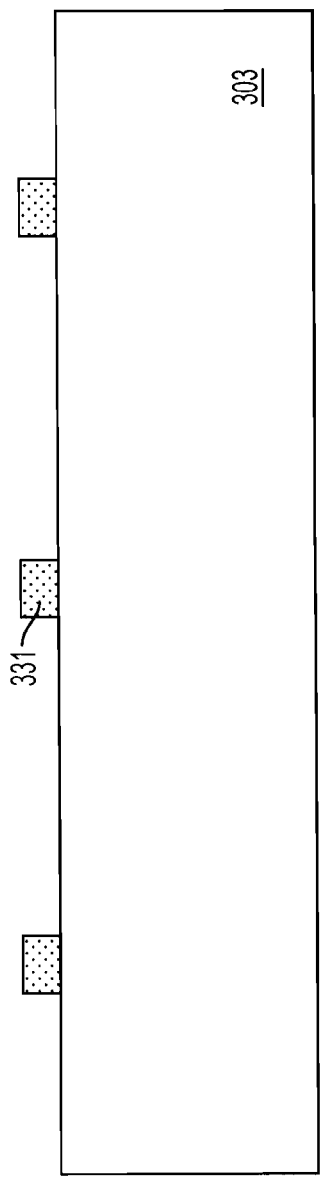

Referring to FIG. 3C, metallic pads 331 can be patterned over a substrate 301. The metallic pads 331 can have a material similar to that of the metallic material 130 described above in conjunction with FIG. 1. The metallic pads 331 can be formed, for example, by physical vapor deposition (PVD) or chemical vapor deposition (CVD), a photolithographic process, and an etch process.

Figure 3D:
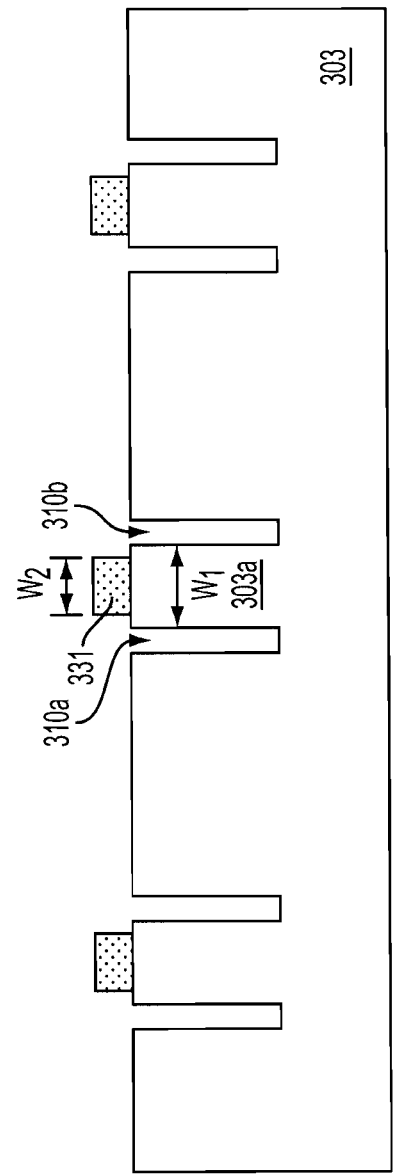

Referring to FIG. 3D, openings 310a and 310b can be formed in the substrate 301. The openings 310a and 310b can be formed, for example, by a photolithographic process, and an etch process. In some embodiments, a width $W_1$ of the substrate 303a below the metallic pad 331 can be larger than a width $W_2$ of the metallic pad 331.

Figure 3E:
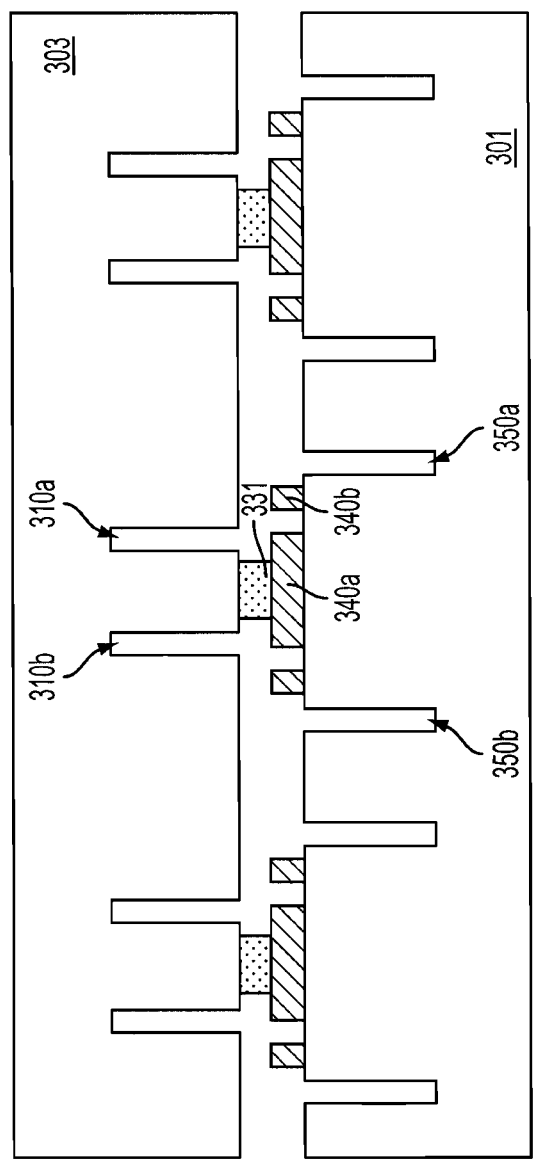
Figure 3F:
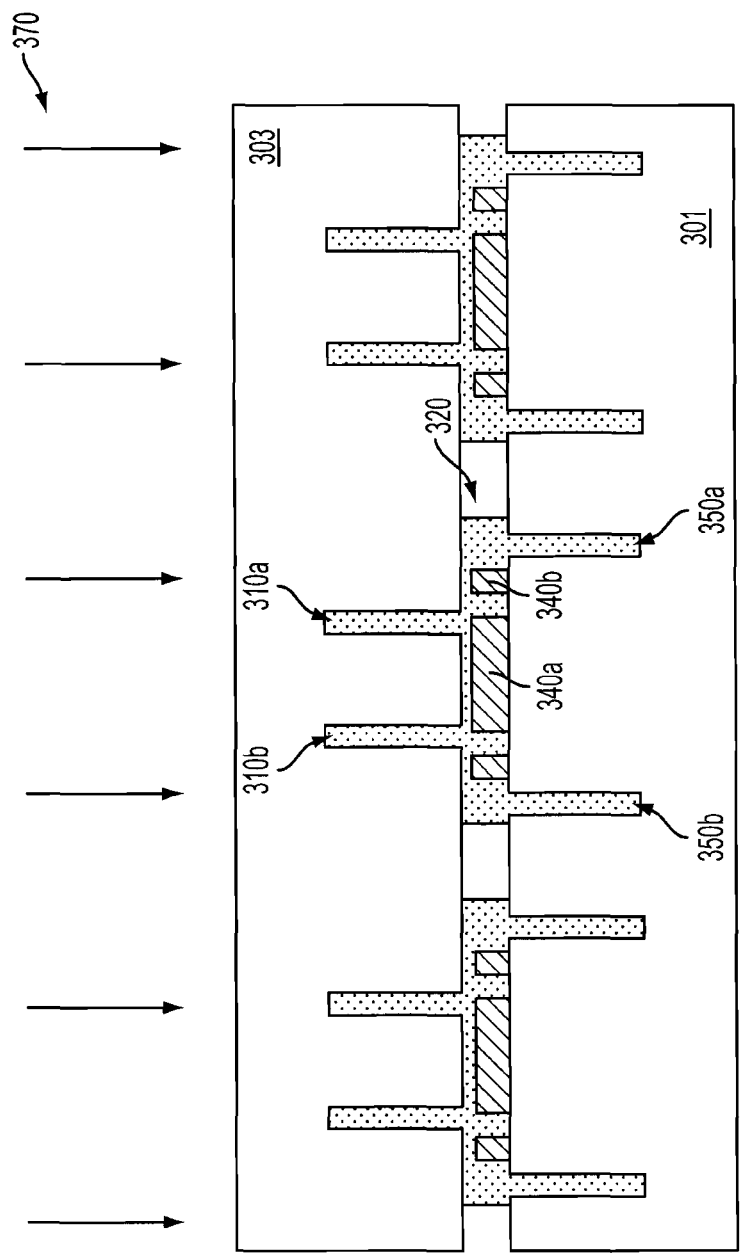

Referring to FIG. 3E, the substrate 303 can be flipped and contact the substrate 301. The metallic pads 331 can be aligned with the respective pads 340a. Referring to FIGS. 2 and 3F, the process shown in block 220 can include bonding the substrate 301 and 303 through at least one electrical bonding material, e.g., an electrical bonding material 320, between the substrate 301 and 303. The bonding process 370 can push a portion of the electrical bonding material 320 at least partially filling in the openings 310a and 310b.

As noted, the bonding process 370 can react the metallic pads 331 with the pads 340a to form electrical bonding, e.g., eutectic bonding. The bonding process 370 can have a process temperature that can soften and/or melt the metallic bonds 331 (shown in FIG. 3E). The bonding process 370 can also press the substrate 303 to the substrate 301. The softened and non-reacted metallic material of the metallic bonds 331 can be at least partially pushed and/or squeezed into the openings 310a and 310b.

It is found that, without the openings 310a and 310b, the non-reacted metallic material of the metallic bonds 331 may contact other non-reacted metallic material of neighboring metallic bonds (not labeled). The metallic materials would be electrically short to each other.

In some embodiments, the optionally-formed guard rings 340b can interact with a portion of the metallic material of the metallic bonds 331. The guard rings 340b can consume and further prevent the non-reacted metallic material of the metallic bonds 331 from contacting other non-reacted metallic materials.

In some embodiments, the optionally-formed openings 350a and 350b can accommodate another portion of the non-reacted metallic material of the metallic bonds 331. The openings 350a and 350b can further prevent the non-reacted metallic material of the metallic bonds 331 from contacting other non-reacted metallic materials.

In some embodiments, the method 200 can include at least one process for grinding and thinning the substrates 301 and 303. The grinding process does not grind the substrate 301 and 303, such that the openings 310a-310b and 350a-350b through the substrates 303 and 301, respectively. In some embodiments, after the grinding process, the package structure shown in FIG. 3F can be subjected to a dicing process to individualize the package systems.

In a first exemplary embodiment, a package system includes a first substrate and a second substrate. The second substrate is electrically coupled with the first substrate. The second substrate includes at least one first opening. At least one electrical bonding material is disposed between the first substrate and the second substrate. A first portion of the at least one electrical bonding material is at least partially filled in the at least one first opening.

In a second exemplary embodiment, a package system includes a first substrate comprising a semiconductor pad. A second substrate comprises a metallic pad electrically coupled with the semiconductor pad. At least one of the first and second substrates comprises at least one opening in which a portion of the material of the metallic pad is at least partially filled.

In a third exemplary embodiment, a method of forming a package system includes providing a first substrate. The first substrate and a second substrate are bonded through at least one electrical bonding material between the first and second substrate. The second substrate comprises at least one first opening. The bonding process pushes a first portion of the at least one electrical bonding material at least partially filling in the at least one first opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package system comprising:
   a first substrate;
   a second substrate electrically coupled with the first substrate, the second substrate comprising at least one first opening; and
   at least one electrical bonding material disposed between the first substrate and the second substrate, wherein a first portion of the at least one electrical bonding material is at least partially filled in the at least one first opening, and the first substrate comprises at least one second opening.

2. The package system of claim 1, wherein the at least one electrical bonding material is a eutectic bonding material, the eutectic bonding material includes a metallic material and a semiconductor material, and the semiconductor material is disposed over the first substrate.

3. The package system of claim 2, wherein the semiconductor material includes a pad and at least one guard ring around the pad.

4. The package system of claim 3, wherein a gap is formed between the pad and the at least one guard ring, and the at least one first opening faces at least one of the pad and the gap.

5. The package system of claim 1, wherein the at least one second opening is configured to accommodate at least a second portion of the at least one electrical bonding material.

6. The package system of claim 5, wherein the at least one first and second openings do not penetrate all the way through the second and first substrates, respectively.

7. The package system of claim 5, wherein the at least one second opening is misaligned from the at least one first opening.

8. A package system comprising:
   a first substrate comprising a semiconductor pad;
   a second substrate comprising a metallic pad electrically coupled with the semiconductor pad, wherein the second substrate comprises at least one first opening, and the first substrate comprises at least one second opening, and a portion of a material of the metallic pad at least partially fills the at least one first opening or the at least one second opening.

9. The package system of claim 8, wherein the metallic pad and the semiconductor pad are configured to form a eutectic bonding between the first and second substrates.

10. The package system of claim 8, wherein the at least one first opening comprises at least one first trench opening.

11. The package system of claim 10, wherein the at least one second opening comprises at least one second trench opening is disposed around the semiconductor pad.

12. The package system of claim 11, wherein the at least one first and second trench openings do not penetrate all the way through the first and second substrates.

13. The package system of claim 11, wherein the at least one second trench opening is misaligned from the at least one first trench opening.

14. The package system of claim 10, wherein a gap is formed between the semiconductor pad and the at least one guard ring, and the at least one first trench opening faces at least one of the semiconductor pad and the gap.

15. The package system of claim 8, wherein the second substrate further comprises at least one guard ring disposed around the semiconductor pad.

16. A package system comprising:
- a first substrate;
- a second substrate electrically coupled with the first substrate, the second substrate comprising at least one first opening; and
- at least one electrical bonding material disposed between the first substrate and the second substrate, wherein the at least one electrical bonding material comprises a pad and at least one guard ring disposed around the pad and a gap between the pad and the at least one guard ring,
- wherein the first substrate comprises at least one second opening, wherein the second opening is positioned between the pad and the at least one guard ring.

17. The package system of claim 16, wherein the gap has a width of about 3 microns (μm).

18. The package system of claim 16, wherein the first substrate comprises at least one second opening and a width and a depth of the at least one second opening are the same as a width and a depth of the at least one first opening.

19. The package system of claim 18, wherein the width of the at least one second opening ranges from about 1 micron (μm) to about 2 μm, and the depth of the at least one second opening ranges from about 2 μm to about 10 μm.

20. The package system of claim 18, wherein the at least one electrical bonding material further comprises a eutectic bonding material, the eutectic bonding material includes a metallic material and a semiconductor material, and the semiconductor material is disposed over the first substrate.

* * * * *